United States Patent [19]

Tran

[11] Patent Number: 4,940,908
[45] Date of Patent: Jul. 10, 1990

[54] METHOD AND APPARATUS FOR REDUCING CRITICAL SPEED PATH DELAYS

[75] Inventor: Thang M. Tran, Austin, Tex.

[73] Assignee: Advanced Micro Devices, Inc., Sunnydale, Calif.

[21] Appl. No.: 343,623

[22] Filed: Apr. 27, 1989

[51] Int. Cl.$^5$ .......................................... H03K 19/01
[52] U.S. Cl. .................................... 307/443; 307/243; 307/269; 307/480; 307/591; 364/488
[58] Field of Search ............... 307/440, 443, 445, 448, 307/451, 475, 480–481, 573, 575, 576–577, 579, 582, 583–585, 243, 269, 591; 364/488–491

[56] References Cited

U.S. PATENT DOCUMENTS

| | | | |
|---|---|---|---|
| 4,263,651 | 4/1981 | Donath et al. | 364/491 X |
| 4,564,772 | 1/1986 | Maley et al. | 307/591 X |
| 4,575,646 | 3/1986 | Saneski | 307/443 |
| 4,612,542 | 9/1986 | Pantry et al. | 307/243 X |
| 4,641,048 | 2/1987 | Pollock | 307/591 |
| 4,691,124 | 9/1987 | Ledzius et al. | 307/480 X |
| 4,698,760 | 10/1987 | Lembach et al. | 364/488 X |
| 4,700,088 | 10/1987 | Tubbs | 307/443 X |
| 4,825,105 | 4/1989 | Hölzle | 307/243 X |
| 4,845,390 | 7/1989 | Chan | 307/591 X |

FOREIGN PATENT DOCUMENTS 0306662 3/1989 European Pat. Off. ............ 307/591

OTHER PUBLICATIONS

"Compensation for Variation in Circuit Delay", *IBM T.D.B.*, vol. 28, No. 12, May 1986, pp. 5180–5182.

*Primary Examiner*—David Hudspeth
*Attorney, Agent, or Firm*—Foley & Lardner, Schwartz, Jeffery, Schwaab, Mack, Blumenthal & Evans

[57] ABSTRACT

A method and apparatus is disclosed for reducing the propagation delay associated with the critical speed path of a binary logic circuit by using "multiplexing logic". More specifically, the inputs to the logic circuit are defined as either critical or non-critical inputs and the product terms are manipulated so that the non-critical inputs are mutually exclusive. The non-critical inputs are supplied to one or more first logic gate structures wherein the ultimate outputs of the first logic gate structures control multiplexer couplers. The critical speed inputs are supplied to one or more second logic gate structures wherein the ultimate outputs of the second logic gate structures are provided as the input to the multiplexer couplers.

6 Claims, 8 Drawing Sheets

FIG. 4

| NON-CRITICAL SPEED INPUTS | | CRITICAL INPUTS | OUTPUTS |
|---|---|---|---|
| AB | CDEF | GHI | 0 |
| 0- | ---- | --- | 0 |
| 10 | ---- | --- | 0 |
| 11 | 0--- | --- | 0 |
| 11 | -0-- | --- | 0 |
| 11 | --0- | --- | 0 |
| 11 | ---1 | --- | 0 |
| 11 | 1--- | 0-- | 0 |
| 11 | 1--- | 10- | 1 |
| 11 | 1--- | 110 | 1 |
| 11 | 1--- | 111 | 0 |
| 11 | -1-- | -0- | 1 |
| 11 | -1-- | --1 | 1 |
| 11 | --10 | 1-- | 0 |
| 11 | --10 | 011 | 1 |

FIG. 5

EQ.1 $O = ABE\bar{F}\,\bar{G}HI + ABC\,G\bar{I} + ABC\,G\bar{H} + ABD\,I + ABD\,H$ EQ.2 $O = AB\,(E\bar{F}GHI + CG\,(\bar{I}+\bar{H}) + D\,(I+\bar{H}))$ EQ.3 $O = ABE\bar{F}\,\bar{G}HI$ $ABC\quad G\,(\bar{I}+\bar{H})$
　　　　$ABD\quad I+\bar{H}$

FIG. 6

NON CRITICAL / CRITICAL $O = AB\bar{D}E\bar{F} \quad \bar{G}HI$
　　$ABC\bar{D} \quad\quad G\,(\bar{I}+\bar{H})$
　　$ABCD \quad\quad G+I+\bar{H}$
　　$AB\bar{C}D \quad\quad I+\bar{H}$

METHOD AND APPARATUS FOR REDUCING CRITICAL SPEED PATH DELAYS

BACKGROUND OF THE INVENTION

The present invention is related to binary logic circuits. More specifically, the present invention provides a method and apparatus for reducing critical speed path delays in binary logic circuits.

The logic designer is commonly faced with the task of designing a complex logic circuit to generate a specific output signal in response to a plurality of input signals. Conventional practice of logic design includes the generation of a truth table for the desired inputs and outputs, the use of a Karnaugh map or a Boolean minimization to generate a set of product terms of inputs for each desired output, and the realization of the product terms in the form of physical logic gates in a combination logic circuit.

The above-described approach to logic design is generally concerned with minimizing the number of logic gates required to realize a physical implementation of truth table. As the number of desired input signals increases, however, complex combinational logic solutions to the truth table generated by the above-described approach result in increased signal propagation times which cause unacceptable delays in the formation of an output signal. This is especially true when speed is a primary design consideration, as is the case in RISC processor technology.

The inputs to the logic circuit can be characterized as either critical speed inputs or non-critical speed inputs. Critical speed inputs are usually those inputs which are valid at a later point in time than the non-critical inputs. Thus, the logic path requiring the critical speed inputs is the slowest logic path of the logic circuit and can be referred to as the critical speed path. A reduction in propagation delay associated with the critical speed would therefore result in an faster output response for the logic circuit, and the ability to operate the logic circuits at faster clock rates.

SUMMARY OF THE INVENTION

The present invention provides a method and apparatus for reducing the propagation delay associated with the critical speed path of a binary logic circuit by using "multiplexing logic", thereby increasing the operating speed of the logic circuit.

More specifically, the inputs to the logic circuit are defined as either critical or non-critical inputs and the product terms are manipulated so that the non-critical inputs are mutually exclusive. The non-critical inputs are supplied to one or more first logic gate structures wherein the ultimate outputs of the first logic gate structures control multiplexer couplers. The critical speed inputs are supplied to one or more second logic gate structures wherein the ultimate outputs of the second logic gate structures are provided as the input to the multiplexer couplers. As the operation of the multiplexer couplers are controlled the output from the first logic gate structures which receive the non-critical speed inputs, the couplers are at a stable state when the output of the second logic gate structures supplied with the critical speed inputs is valid. Thus, the total propagation delay associated with the critical speed path is limited to the delay attributable to the logic gate structures associated with the critical speed inputs logic gate and the multiplexer couplers.

BRIEF DESCRIPTION OF THE DRAWINGS

With the above as background, reference should now be made to the following detailed description of the preferred embodiments of the invention and the figures in which:

FIG. 4 is a truth table generated from nine inputs and one output;

FIG. 5 is a table illustrating the product terms generated from the truth table in FIG. 4

FIG. 6 is a table illustrating manipulation of the product terms in the table of FIG. 5 to generate mutually exclusive non-critical product terms;

DETAILED DESCRIPTION OF THE PREFERRED EMBODIMENTS

Figure 1:
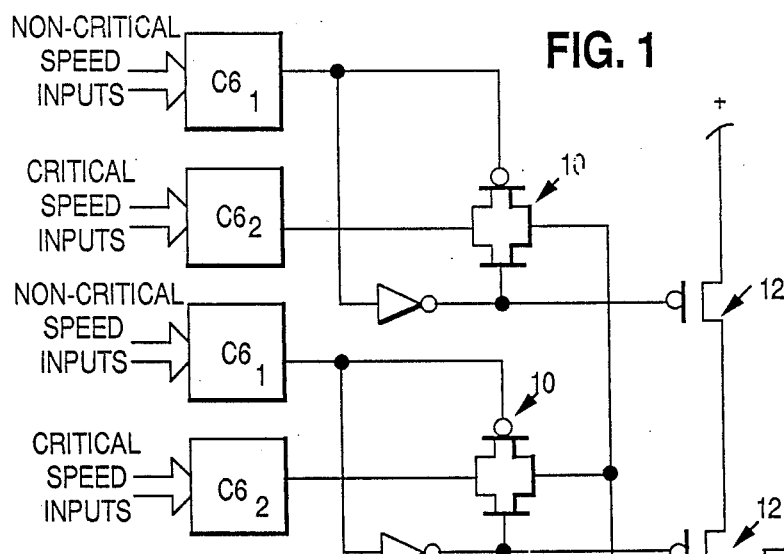
FIG. 1 is a block diagram of a logic circuit according to a first embodiment of the present invention.

A block diagram of a logic circuit in accordance with a first embodiment of the present invention is illustrated in FIG. 1. Mutually exclusive non-critical speed inputs and critical speed inputs are separated so that the mutually exclusive non-critical speed inputs are supplied to one or more gate structures CG1 and the critical inputs are supplied to one or more gates structures CG2. The outputs of the gate structures CG1 are connected to the control gates of multiplexer couplers 10 whose inputs are connected to the outputs of the gate structures CG2. The gate structures CG1 and CG2 contain one or more logic gates or inverters combined to generate an output signal in response to one or more input signals.

The outputs from the first logic gate structures CG1 activate the multiplexer couplers 10 permitting the output signal of the second logic gate structures CG2 to be passed to the output interface 9 of the logic circuit. As the multiplexer couplers 10 are controlled by the non-critical speed inputs, the couplers 10 are stable when the output of the second logic gate structures CG2 is valid. Thus, the total propagation delay associated with the critical speed path is limited to the delay associated with the second logic gate structures CG2 and the coupler 10.

In the embodiment illustrated, the output interface 9 of the logic circuit includes an inverter 14 coupled to the multiplexer couplers 10. Pull up transistors 12 are provided to pull the input of an inverter 14 to a logic high level in order to drive the output of the logic circuit to a logic low level when the multiplexer couplers 10 are not activated.

Figure 2:
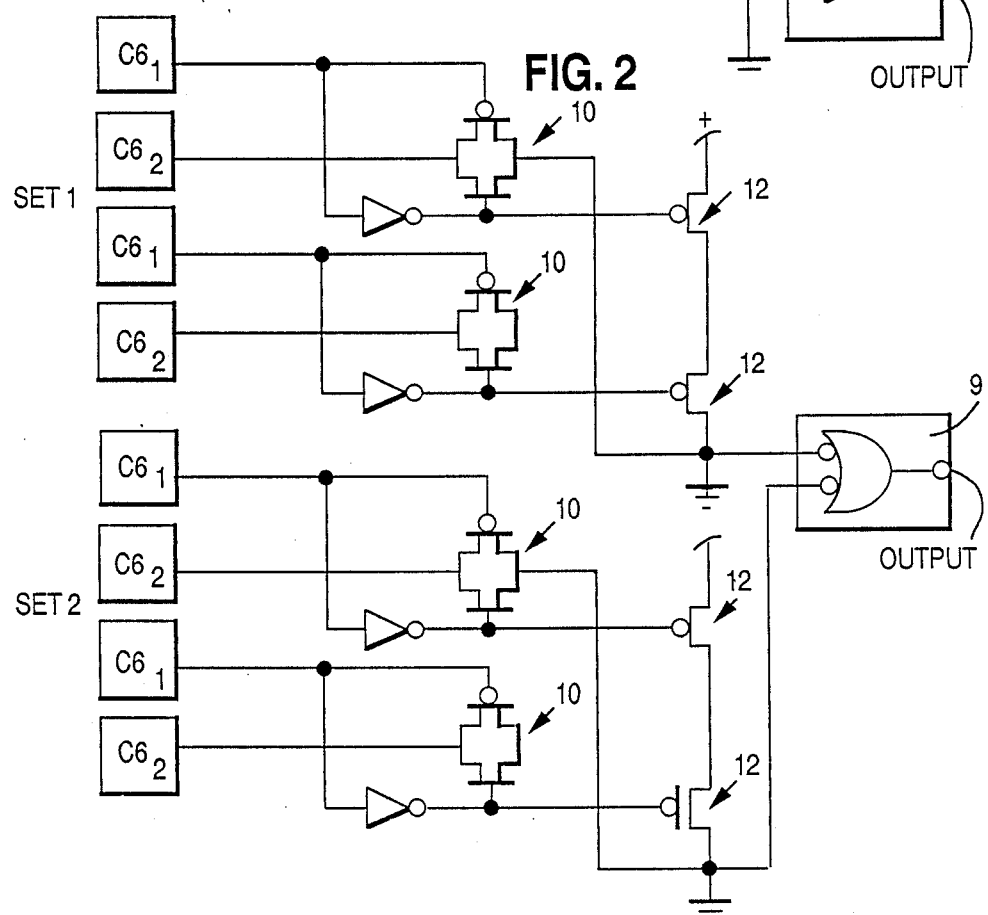
FIG. 2 is a block diagram of a logic circuit according to a second embodiment of the present invention.
Figure 3:
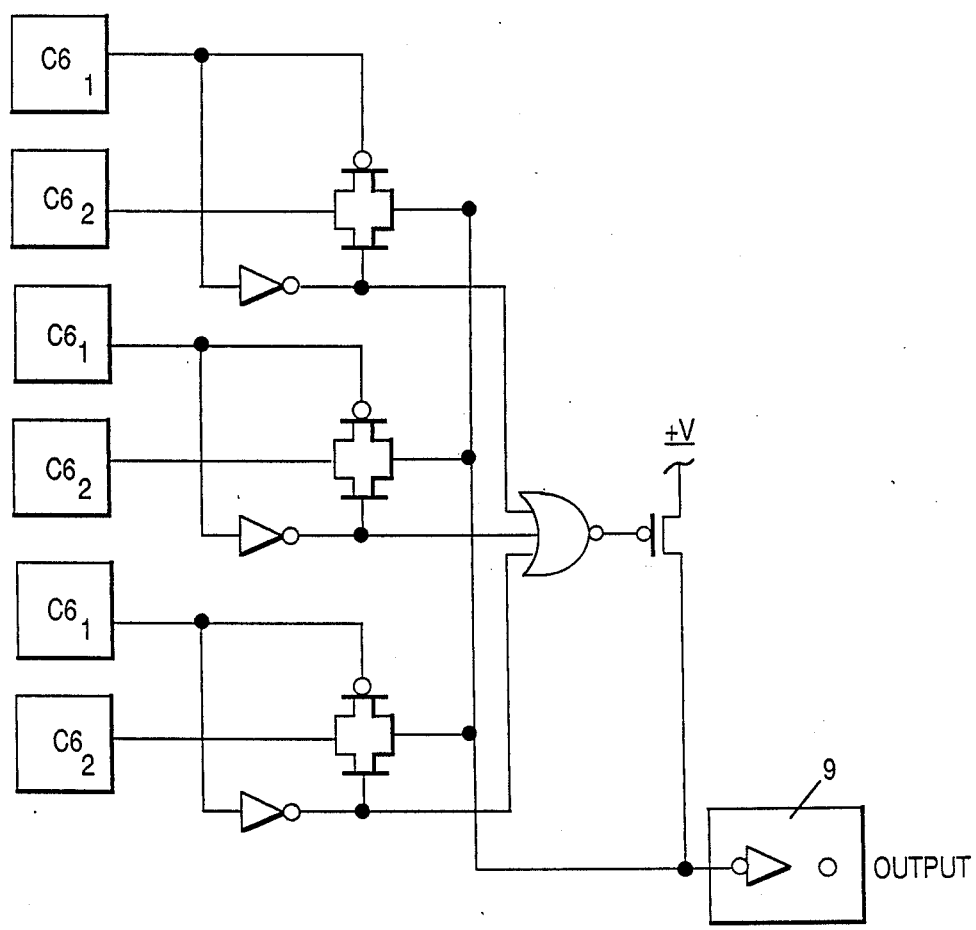
FIG. 3 is a block diagram of a logic circuit according to a third embodiment of the present invention.

In some cases, the number of product terms may become excessive and the multiplexer couplers can be broken into two or more sets as illustrated in FIG. 2. The control signals of the two sets do not have to be mutually exclusive, and the outputs from the sets can then be supplied to an OR gate to generate the circuit output with approximately the same delay as the arrangement illustrated in FIG. 1. The requirement for a large number of pull up transistors can also be overcome by connecting the outputs of first logic gate structures CG1 that control the operation of the multiplexer couplers 10 to a NAND gate as illustrated in FIG. 3.

Figure 7A:
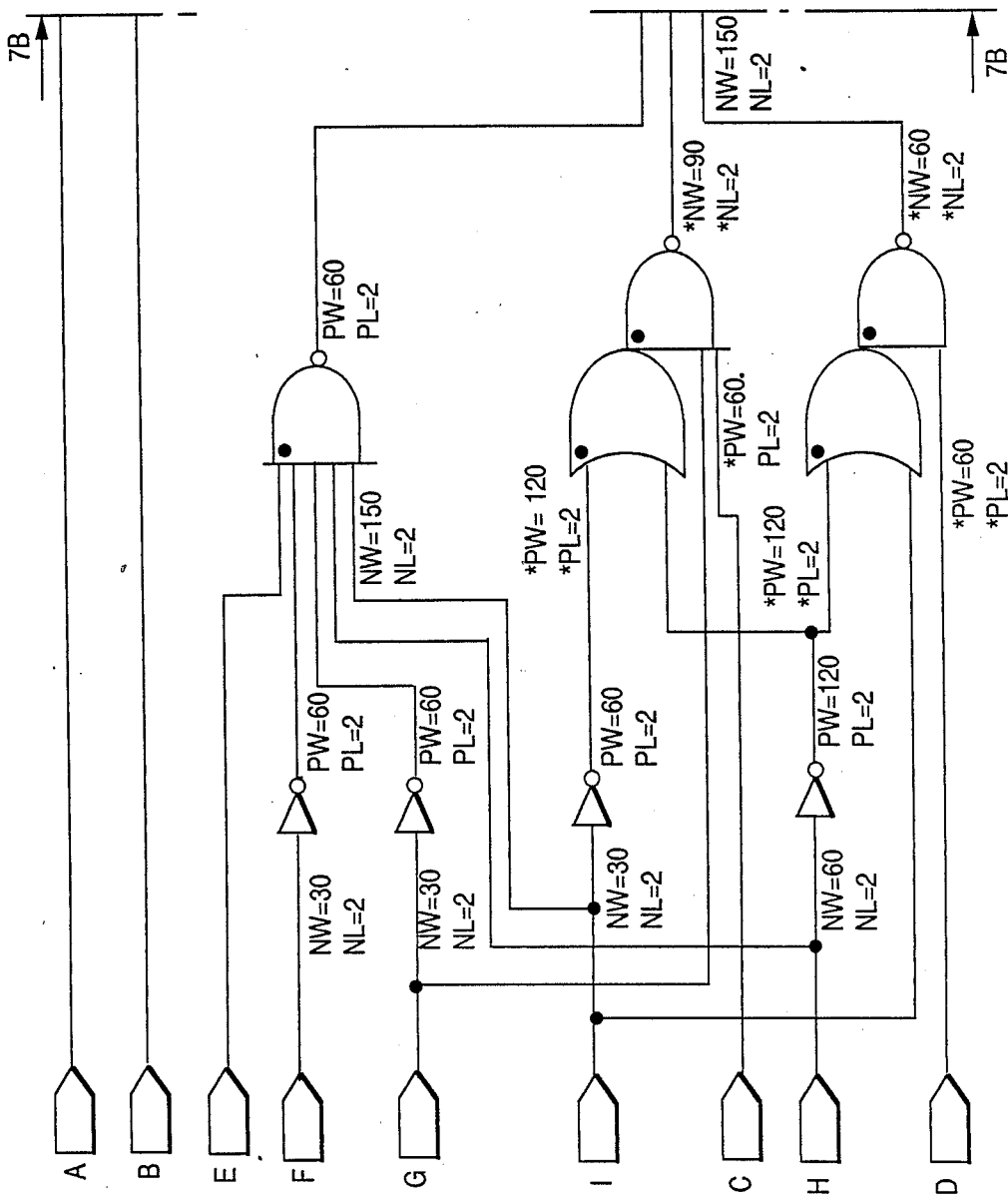
FIGS. 7A and 7B respectively illustrate schematic diagrams of a conventional combinational logic circuit and an example of a logic circuit in accordance with a first embodiment of the invention as illustrated in block diagram form in FIG. 1.

A more detailed explanation of the present invention will be discussed with reference to FIG. 4, which illustrates a truth table for nine desired inputs (A-I) and one output (O). In the example illustrated, inputs A-F are non-critical speed inputs, inputs G-I are critical speed inputs, and it is assumed that E and C are mutually exclusive. As with the conventional method of logic design discussed above, Karnaugh mapping or a Boolean minimization computer program, such as EX-PRESSO Version 2.2 released by the University of California Berkeley, is used to generate product terms for the inputs illustrated in the truth table of FIG. 4. For example, the EXPRESSO computer program mentioned above was used to generate the product terms illustrated in FIG. 5. Equation 3 in FIG. 5 represents the product terms separated into a set of non-critical speed inputs and a set of critical speed inputs. FIG. 7A illustrates a conventional combinational logic implementation of the product terms illustrated in FIG. 5.

The set of non-critical speed inputs illustrated in FIG. 5 are not mutually exclusive. For example, the combination of inputs ABC and ABD can occur at the same time which would result in two multiplexer couplers being activated simultaneously. In accordance with the present invention, the product terms must therefore be manipulated to make the set of non-critical inputs mutually exclusive as shown in FIG. 6. The non-critical inputs must be mutually exclusive as they are used to generate the control signals for the multiplexer couplers, and only one multiplexer coupler can be selected at one time. The manipulation of the product terms to yield a mutually exclusive set of non-critical inputs would be readily apparent to one of ordinary skill in the art. A simple example is illustrated below using four inputs WXYZ.

---

Example:   Critical Speed Inputs WX;
           Non-Critical Speed Inputs YZ;
           Product Terms YW$\overline{X}$ + ZWX;
           Non-critical speed inputs (Y,Z) are
           not mutually exclusive.
Product term YW$\overline{X}$ can be expanded to $\underline{YZ}$W$\overline{X}$ + Y$\overline{Z}$W$\overline{X}$;
Product term ZWX can be expanded to $\overline{Y}$ZWX + YZWX;
Reduce YZW$\overline{X}$ + Y$\overline{Z}$W$\overline{X}$ + $\overline{Y}$ZWX + YZWX to
YZW$\overline{X}$ + $\overline{Y}$ZWX + YZW;
Non-critical speed inputs (Y$\overline{Z}$, $\overline{Y}$Z, YZ) are mutually exclusive.

---

Figure 7B:
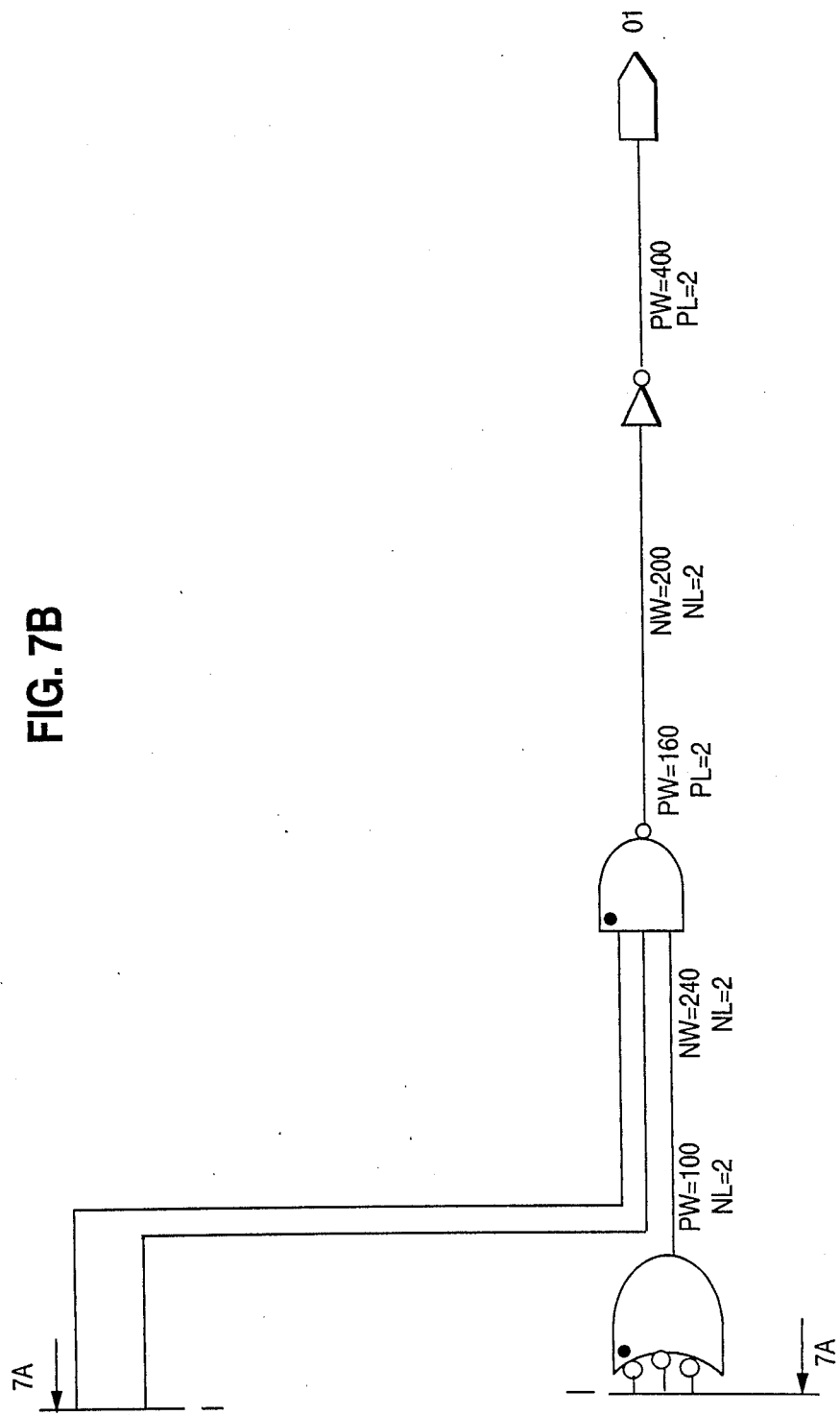
Figure 7C:
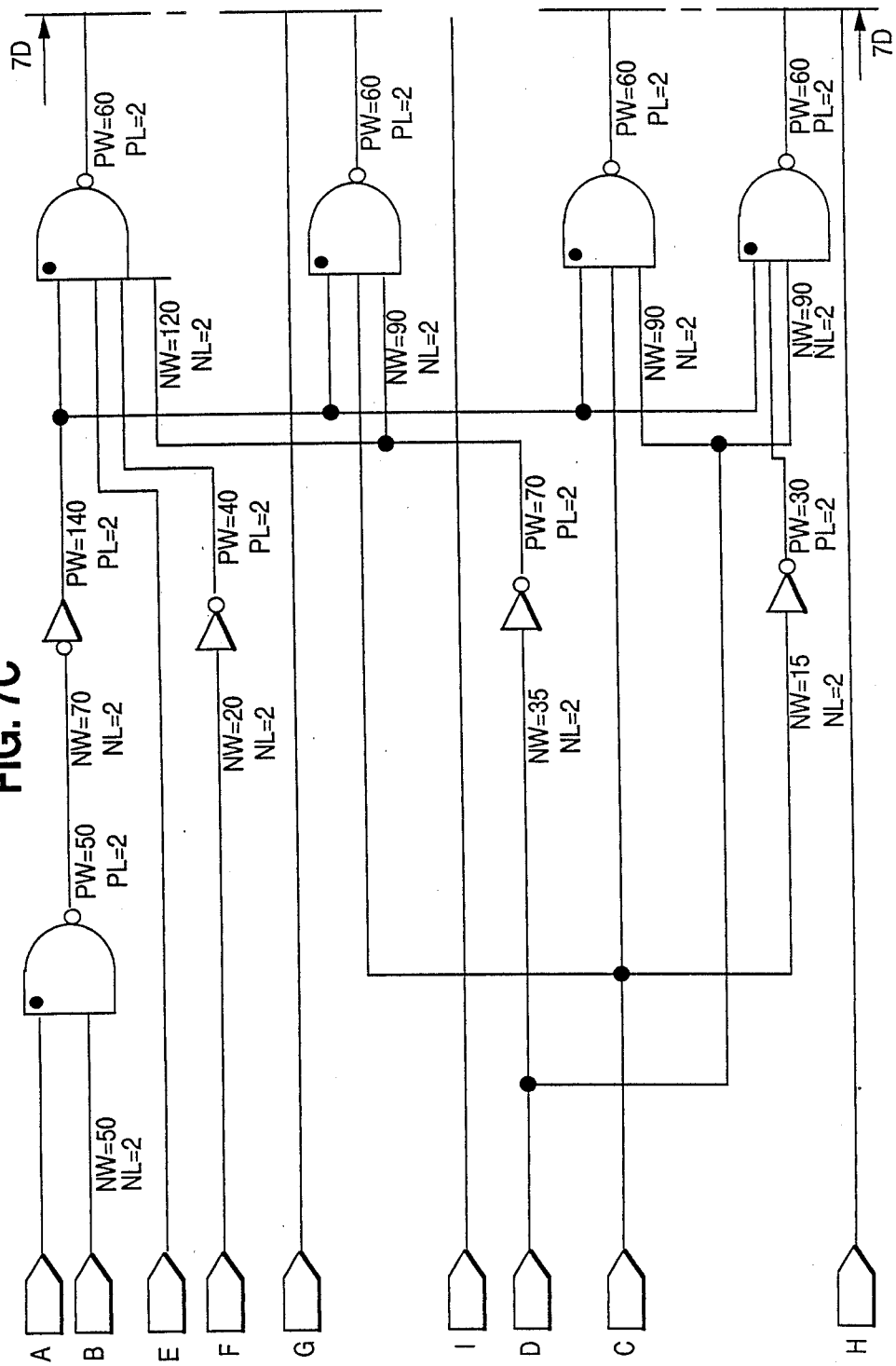
Figure 7D:
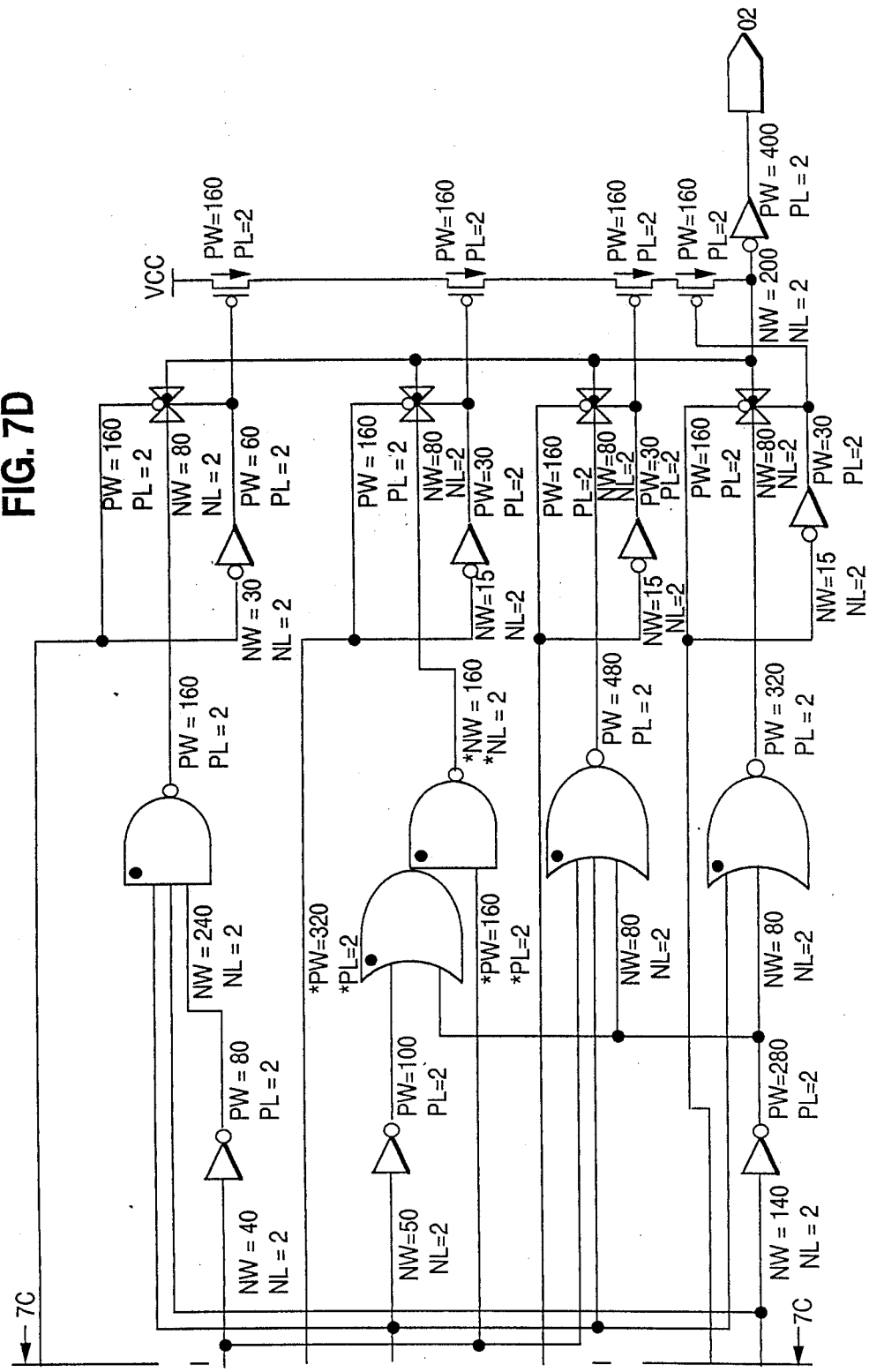

Referring now to FIG. 7B, the product terms illustrated in FIG. 6 can now be physically implemented with logic gates. The non-critical speed inputs are supplied to a logic gate or a series of gates (CG1) having an output which ultimately controls one of the couplers 10. The critical speed inputs are supplied to logic gates or a series of gates (CG2) having an output which ultimately is controlled by one of the couplers 10. In comparing the logic circuits illustrated in FIGS. 7A and 7B, it can be readily appreciated that the critical speed inputs are required to pass through a smaller number of gates in the logic circuit illustrated in FIG. 7B than the logic circuit illustrated in FIG. 7A.

Figure 8:
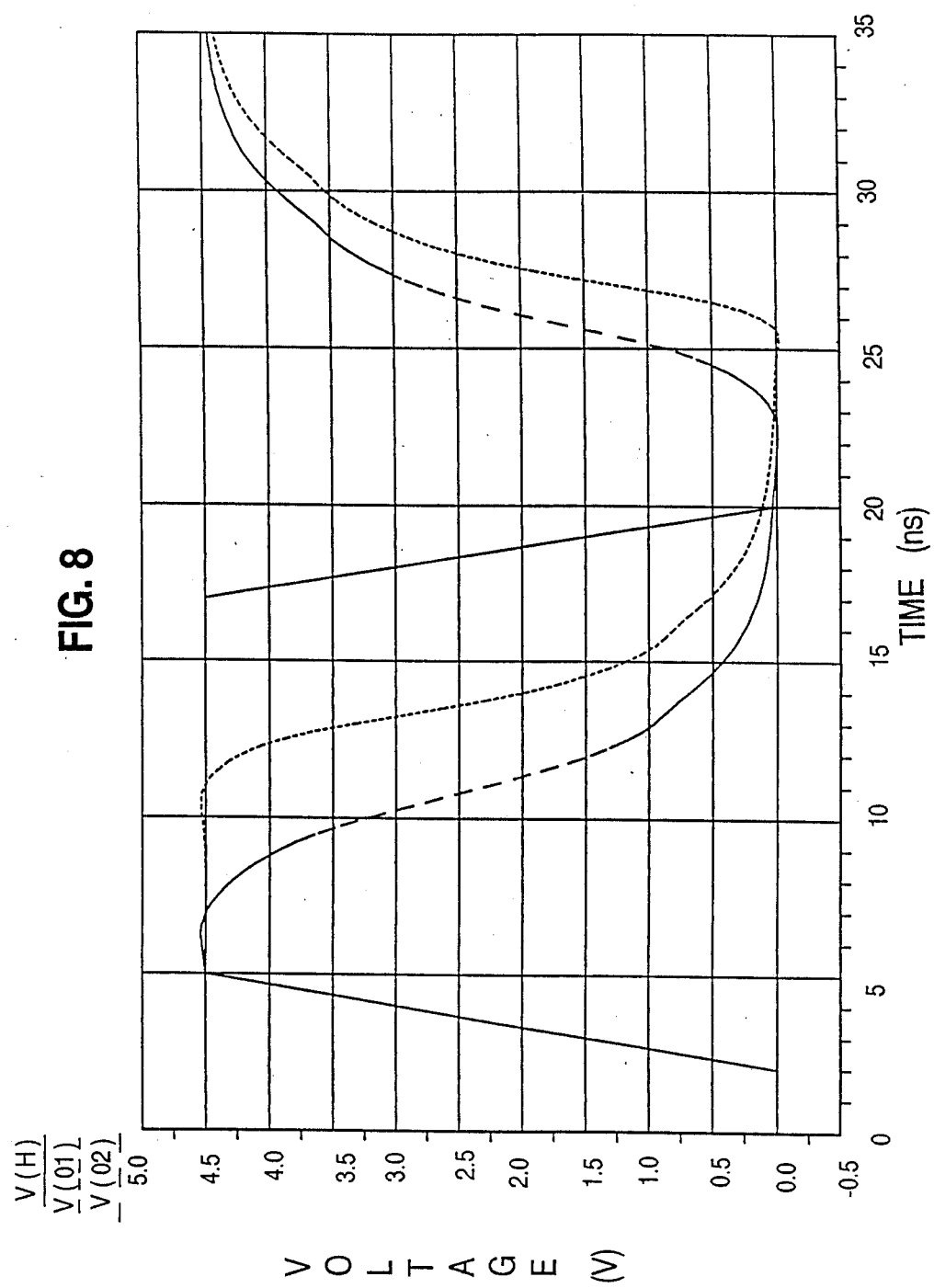
FIG. 8 is a graph illustrating the output response of the logic circuits illustrated in FIGS. 7A and 7B.

A comparison of the response of the logic circuits shown in FIGS. 7A and 7B is provided in FIG. 8. The improvement in the output response of a logic circuit designed in accordance with the present invention actually increases with the complexity of the overall logic circuit.

In effect, the use of the multiplexer couplers permits the creation of separate logic paths for both the critical and non-critical speed inputs. Thus, the critical speed path is optimized resulting in an increase in the operating speed of the logic circuit, even though the overall circuit design may require more gates than a conventional minimized combinational logic circuit.

Another important advantage provided by the present invention is that simulation of the worst case output response of the logic circuit is also simplified. In the case of conventional logic circuits, separate simulations are required for each combination of input signals to determine the worst case response time of the logic circuit. In contrast, the present invention requires the critical speed inputs to be separated so that the critical speed path is readily defined, requiring that only a single simulation of the critical speed path be run to determine the worst case response time of the logic circuit.

It will be understood that the above description is of preferred exemplary embodiments of the present invention, and the invention is not limited to the specific forms shown. For example, different gate configurations and output interfaces may be readily employed, and it may be desirable to have a logic circuit that generates a high logic level output when the couplers are turned off. Such modifications would be readily apparent to one of ordinary skill in the art. Additional variations and modifications can be effected within the spirit and scope of the appended claims.

What is claimed:

1. A logic circuit comprising a plurality of mutually exclusive non-critical speed inputs coupled to at least one first logic gate structure having a first gate output, at least one critical speed input coupled to at least one second logic gate structure having a second gate output, at least one multiplexer coupler responsive to said first gate output to selectively couple said second gate output to an output interface of said logic circuit.

2. A logic circuit as claimed in claim 1, wherein said output interface of said logic circuit includes an inverter coupled to said multiplexer coupler and further comprising at least one pull up transistor coupled to said inverter that pulls the input of said inverter to a logic high level in order to drive the output of said inverter to a logic low level.

3. A logic circuit comprising at least two groups of mutually exclusive non-critical speed inputs, each group of mutually exclusive non-critical speed inputs being coupled to at least one corresponding first logic gate structure having a first gate output, at least one critical speed input corresponding to each of said groups of mutually exclusive non-critical speed inputs being coupled to at least one second logic gate structure having a second gate output, at least one multiplexer coupler responsive to said first gate output to selectively couple said second gate output to an output interface of said logic circuit.

4. A logic circuit as claimed in claim 3, wherein said output interface of said logic circuit includes an inverter coupled to said multiplexer coupler and further comprising at least one pull up transistor coupled to said inverter that pulls the input of said inverter to a logic high level in order to drive the output of said inverter to a logic low level.

5. A method of operating a logic circuit comprising the steps of supplying a plurality of mutually exclusive non-critical speed input signals to at least one first logic gate structure and generating a first gate output signal in response thereto, supplying at least one critical speed input to at least one second logic gate structure and generating a second gate output signal in response thereto, controlling the operation of at least one multiplexer coupler in response to said first gate output signal to selectively pass said second gate output signal to an output interface of said logic circuit.

6. A logic circuit comprising first means for supplying a plurality of mutually exclusive non-critical speed input signals to at least one first logic gate structure and generating a first gate output signal in response thereto, second means for supplying at least one critical speed input to at least one second logic gate structure and generating a second gate output signal in response thereto, and means for controlling the operation of at least one multiplexer coupler in response to said first gate output signal generated by said first means to selectively pass said second gate output signal generated by said second means to an output interface of said logic circuit.

* * * * *

UNITED STATES PATENT AND TRADEMARK OFFICE
CERTIFICATE OF CORRECTION

PATENT NO. : 4,940,908
DATED : July 10, 1990
INVENTOR(S) : Thang Minh Tran

It is certified that error appears in the above-indentified patent and that said Letters Patent is hereby corrected as shown below:

In the drawings, Figure 1, sheet 1, the input to inverter 14 should not be coupled to ground.

In the drawings, Figure 2, sheet 1, the inputs to output interface 9 should not be coupled to ground.

In the drawings, Figure 3, sheet 2, the NOR gate should be a NAND gate having each of three inputs coupled to the non-inverted output of one of the three logic structures C6.

In the drawings, Figure 5, sheet 3, the term "ABDH" in EQ. 1 should read --ABD$\overline{H}$--.

UNITED STATES PATENT AND TRADEMARK OFFICE
CERTIFICATE OF CORRECTION

PATENT NO. : 4,940,908
DATED : July 10, 1990
INVENTOR(S) : Thang Minh Tran

It is certified that error appears in the above-indentified patent and that said Letters Patent is hereby corrected as shown below:

In the drawings, Figure 5, sheet 3, the terms

"$AB\overline{EF}\ \overline{G}HI$
$ABC\ G(\overline{I}+\overline{H})$
$ABD\ I+\overline{H}$" in EQ. 3 should read --$AB\overline{EF}\ \overline{G}HI$
$+\ ABC\ G(\overline{I}+\overline{H})$
$+\ ABD\ (I+\overline{H})$--.

In column 1, line 61, "controlled", should read --controlled by--.

In column 2, lines 37, 38, 39, 40, 42, 45, 47, 51 and 54, each occurrence of "CG" should read --C6--.

In column 3, line 5, line 57, and line 60, each occurrence of "CG" should read --C6--.

Signed and Sealed this

Twentieth Day of September, 1994

Attest:

BRUCE LEHMAN

Attesting Officer  Commissioner of Patents and Trademarks